(12) United States Patent
Larson et al.

(10) Patent No.: US 6,735,424 B1
(45) Date of Patent: May 11, 2004

(54) S-BAND LOW-NOISE AMPLIFIER WITH SELF-ADJUSTING BIAS FOR IMPROVED POWER CONSUMPTION AND DYNAMIC RANGE IN A MOBILE ENVIRONMENT

(75) Inventors: Lawrence Larson, San Diego, CA (US); Wei Xiong, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 222 days.

(21) Appl. No.: 09/595,508

(22) Filed: Jun. 14, 2000

(51) Int. Cl.[7] .............................. H04B 1/06; H04B 7/00
(52) U.S. Cl. ................... 455/250.1; 455/126; 455/127; 330/285; 330/136
(58) Field of Search ............................... 455/1, 7, 11.1, 455/24, 26.1, 69, 115, 126; 330/285, 136

(56) References Cited

U.S. PATENT DOCUMENTS

| | | | | |
|---|---|---|---|---|
| 4,462,004 A | * | 7/1984 | Cox et al. | 330/277 |
| 5,132,632 A | * | 7/1992 | Russell et al. | 327/119 |
| 5,361,007 A | | 11/1994 | Ohta | |
| 5,426,641 A | | 6/1995 | Afrashteh et al. | |
| 5,532,646 A | * | 7/1996 | Aihara | 330/279 |
| 5,712,593 A | * | 1/1998 | Buer et al. | 330/129 |
| 5,757,237 A | | 5/1998 | Staudinger et al. | |
| 5,789,983 A | * | 8/1998 | Fujita | 330/277 |
| 5,805,515 A | | 9/1998 | Suzuki | |
| 6,118,339 A | * | 9/2000 | Gentzler et al. | 330/149 |
| 6,194,968 B1 | * | 2/2001 | Winslow | 330/289 |
| 6,239,658 B1 | * | 5/2001 | Tham | 330/279 |
| 6,331,799 B1 | * | 12/2001 | Miyazawa | 327/538 |

OTHER PUBLICATIONS

Wei Xiong and Lawrence E. Larson "An S–band Low Noise Amplifier with Self–Adjusting Bias for Improved Power Consumption and Dynamic Range in a Mobile Environment", IEEE Radio Frequency Integrated Circuits Symposium, 1999,.*

Xiong et al., "An S–band Low–Noise Amplifier with Self-–Adjusting Bias for Improved Power Consumption and Dynamic Range in a Mobile Environment", IEEE MTT–S International Microwave Symp. Digest, pp. 497–500, 1999.

* cited by examiner

*Primary Examiner*—William Trost
*Assistant Examiner*—Sharad Rampuria
(74) *Attorney, Agent, or Firm*—Greer, Burns & Crain, Ltd.

(57) ABSTRACT

A discrete low-noise amplifier designed to operate in a mobile wireless environment uses two cascaded GaAs FETs to achieve 25 dB gain and 0.9 dB noise figure at 2.5 GHz. Active bias control circuitry responsive to monitored amplifier output power automatically and continuously adjusts the drain-source currents, and the load lines, of the cascaded FETs to (i) maintain power consumption at 33 milliwatts in nominal small-signal conditions, and to (ii) provide an elevated input third-order intermodulation intercept point (IP3) and a reduced noise figure during the presence of jamming. A 15 dB improvement in the input IP3 is achieved in large-signal operation. Amplifier operation is supported by an a.c. power detector of enhanced sensitivity and responsiveness because of un-grounded operation.

12 Claims, 4 Drawing Sheets

S-BAND LOW-NOISE AMPLIFIER WITH SELF-ADJUSTING BIAS FOR IMPROVED POWER CONSUMPTION AND DYNAMIC RANGE IN A MOBILE ENVIRONMENT

BACKGROUND OF THE INVENTION

1. Field of the Invention

The present invention generally concerns amplifier design and amplifier operation, particularly for wireless cellular radio communications applications where occasional jamming is prevalent.

The present invention particularly concerns the realization by both design and operation of a Low Noise Amplifiers (LNA) simultaneously improved in (i) dynamic range and (ii) overall power consumption, these seemingly contradictory requirements being satisfied by optimizing power consumption in the LNA in consideration of its instant operating environment.

The present invention further particularly concerns an ungrounded power detector that is both fast and sensitive to detect the output power of, for example, a LNA.

2. Description of the Prior Art

2.1 Low Noise Amplifiers, and Amplifier Operation in the Presence of Jamming With the explosive growth of wireless communications, the airwaves are rapidly being filled with signals of varying strengths and frequencies. Immunity to jamming has subsequently become a significant concern to any communication system. This is especially true for a mobile communication system, such as a cellular phone, as it is difficult to predict the jamming environment the system will be exposed to. At the same time, the need for portability, and thus long battery life, requires the system to consume as little power as possible.

In a typical wireless system, filtering before the low-noise amplifier can reject most jammers. However, a high rejection ratio incurs high insertion loss—a direct contributor of receiver sensitivity degradation. In addition, many close-in jammers are impossible to block given the size and cost restrictions of a mobile system. A number of different jammers including frequency modulation radio, television, navigational beacons, and microwave ovens will typically be detected by an omni-directional 2.5 GHz antenna. The low-noise amplifier, therefore, must have a large dynamic range: namely, a low noise figure and low intermodulation distortion. See S. Chen, "*Linearity Requirements for Digital Wireless Communi-cation,*" IEEE GaAs IC Symp. Dig., Anaheim, Calif., pp. 29–32, October 1997.

To meet these demands, the LNAs often consume the most power in a receiver; tradeoffs are usually required to balance dynamic range versus power consumption.

2. Power Detector

Power detector circuits are many and various, and are not commonly identified as requiring improvement. The low noise amplifier circuit of the present invention will show, however, that it is useful (but not necessary) to detect instantaneous amplifier output power, or (equivalently) voltage (into load), with two orders of magnitude (i.e., ×100) greater sensitivity that existing Schottky diode power detectors. To this end the present invention will be found to encompass a power detection circuit that is particularly characterized in that the power is not detected relative to ground, ergo an un-grounded power detection circuit. When a signal in which power is detected need not be sunk to, nor referenced relative to, ground, then it becomes possible to detect variations in the signal with much greater sensitivity.

SUMMARY OF THE INVENTION

The present invention contemplates a Low Noise Amplifier (LNA) that circumvents the compromise between (i) dynamic range and (ii) power consumption by optimizing power consumption for the operating environment. The LNA of the present invention exhibits a high dynamic range when it is near or in compression, but low power consumption when it is in small-signal operation where a large dynamic range is not necessary.

Furthermore, the dynamic range of the amplifier is extended: jamming may be countenanced without such distortion as would otherwise occur.

The present invention further contemplates an un-grounded a.c. signal power detection circuit that is very sensitive and very fast. This un-grounded power detection circuit will prove useful, even if not absolutely essential, in an s-band low-noise amplifier that is, in accordance with the present invention, improved for both power consumption and dynamic range, especially as both are required in a mobile environment.

1. A Method of Operating an Amplifier

In one of its aspects the present invention is embodied in a method of operating an amplifier where the amplifier—or, more exactly, the transistor components of the amplifier—has an load line. The amplifier is operated so as to emulate the property of a class AB amplifier where increasing amplifier input current raises the d.c. bias of the amplifier and increases amplifier output current. The amplifier is so operated nonetheless that it will never enter into class AB operation and will always operate in class A.

The method of operating an amplifier always in class A nonetheless to producing more output current from more input current includes two steps: 1) The amplified output of the class A amplifier is monitored; and, in response to detecting an increase in the amplifier output, 2) the load line of the amplifier is dynamically biasing to a higher d.c. bias point, causing the amplifier to consume more power and to produce a still larger amplified output signal. This "boosting" of the amplifier output could obviously cause a runaway condition, but this "boosting" is realized, in accordance with the present invention, so as to always maintain the amplifier to operate in class A.

The purpose of so operating a class A amplifier is demonstrated when the amplifier is used, inter alia, as an initial low-noise radio signal amplifier in a wireless communication system. In this environment an increase in amplifier output signal is indicative of a presence of a strong jammer component in the amplifier input signal. Moving the load line of the amplifier will cause the amplifier to draw more current, beneficially decreasing a noise figure while increasing gain of the amplifier. The amplifier will ultimately be caused to reach a new steady state with higher power and improved linearity. This improved response comes, of course, at the cost of increased power consumption, Conversely, if no increase in amplifier output signal is detected then this is indicative that no strong jammer component is present within the amplifier input signal. In such a case neither the d.c. bias, nor the load line, will be raised, and the amplifier will operate quiescently, conserving power.

2. An Amplifier of Improved Dynamic Range

In another of its aspects, the present invention can be considered to be embodied in an amplifier of improved dynamic range.

The amplifier includes at least one Field Effect Transistor (FET) receiving at its gate an input signal from an external source, and amplifying this input signal in accordance with its drain-source bias voltage $V_{DS}$ to produce at its drain an amplified output signal.

A power detector circuit monitors the amplified output signal to produce a detected-power voltage signal $V_{DD}$.

A dynamic bias control circuit compares the detected-power signal $V_{DD}$ to the drain-source bias voltage $V_{DS}$ so as to vary a gate-to-source voltage bias $V_{GS}$ of the input signal, actively moving a load line of the FET so as to cause the FET to consume more power when the amplified output signal becomes large.

The amplified output signal typically so becomes large because of a presence of a strong jammer component of the input signal. In this eventuality moving the load line of the at least one FET will cause the FET to draw more current, beneficially decreasing noise figure while increasing gain. Ultimately the amplifier of which the at least one FET forms a part to reach a new steady state with higher power and improved linearity.

However, when no strong jammer component of the input signal is present, and when the amplified output signal is correspondingly not large, then the FET, and the amplifier of which it forms a part, will remain biased in an operational condition where power is conserved.

Accordingly, the self-adjusting bias of the at least one FET results in both (i) improved power consumption and (ii) improved dynamic range in an environment where exists occasional strong jammer signals.

The at least one Field Effect Transistor (FET) preferably consists of two cascaded FETs, and more preferably consists of two cascaded FETs where each is a GaS FET. The first, input, one of the two cascaded FETs is most preferably a low-noise PHEMT while the second, output, one of the two cascaded FETs is most preferably a hetero-junction FET.

The dynamic bias control circuit preferably consists of two operational amplifiers each varying a gate-to-source voltage bias $V_{GS}$ of an associated FET.

The power detector circuit preferably consists of a resistor R, and a first diode $D_1$ series connected to form a diode-limited resistive divider. This diode-limited resistive divider is preferably temperature compensated by a second diode $D_2$, making that the power detector circuit of which it forms a part is also temperature compensated.

The amplifier is normally operational in S-band.

3. A Low-Noise Amplifier (LNA) Improved for Having an Elevated Third-Order Input Intercept Point (IP3) and a Reduced Noise Figure During Jamming In yet another of its aspects, the present invention can be considered to be embodied in a low-noise amplifier (LNA) improved for having an elevated third-order input intercept point (IP3) and reduced noise figure during jamming.

The LNA includes (i) at least one active device amplifying in accordance with a bias signal an input signal received from an external source so as to produce an amplified output signal, (ii) a power detector monitoring the amplified output signal to produce a detected-power signal, and (iii) a dynamic bias control circuit responsive to any difference between the detected power signal and the bias signal to increase the bias signal. This increase in the bias signal actively moves a load line of the at least one active device so as to cause this device to consume more power when the amplified output signal is large.

By this operation, when the amplified output signal is large because of a presence of jamming then the moved load line of the at least one active device will cause the active device to draw more current, decreasing noise figure while increasing gain. The amplifier of which the at least one active device forms a part will be caused to reach a new steady state with higher power and improved linearity.

The power detector, the dynamic bias control circuit and the at least one active device preferably function in concert so that when no jamming is present then, at nominal small-signal conditions, the at least one active device will be biased to consume less power, conserving power in the amplifier of which it forms a part.

4. A Method of Low-Noise Amplification

In still yet another of its aspects, the present invention can be considered to be embodied in a method of low-noise amplification that is improved for (i) conserving power during nominal small-signal conditions, and also for (ii) increasing amplification gain, and reducing amplification noise figure, during input signal jamming, making less likely any loss of data.

The method consists of amplifying in at least one active device—and in accordance with a bias signal—an input signal received from an external source so as to produce an amplified output signal.

This amplified output signal is monitored in a power detector to produce a detected-power signal.

Responsively to any difference between this detected power signal and the bias signal, the bias signal of the of at least one active device is adjusted in a dynamic bias control circuit so as to actively move a load line of this at least one active device. This movement of the load line causes this at least one active device to consume more power when the amplified output signal is large.

Accordingly, when the amplified output signal is large because of the presence of jamming (as in the cellular radio environment) the moved load line of the at least one active device will cause the active device to draw more current, decreasing noise figure while increasing gain. The amplifying will reach a new steady state with higher power and improved linearity.

However, when no jamming is present then, at nominal small-signal conditions, the at least one active device will be biased by the adjusting so as to consume less power, conserving power.

5. The Present Invention Expressed With Less Emphasis on Amplifier Power, and With More Emphasis on Amplifier Distortion The previous explanations of the present invention, including that of the immediately previous section 4., have emphasized the situation-variable power consumption of a low-noise amplifier in accordance with the present invention, stating that the use of more power (more current) will, in the presence of jamming, serve to decrease the amplifier noise figure and distortion (while increasing gain). While a practitioner of amplifier design and amplifier operation will understand that 1) power and 2) distortion are "two sides of the same coin", it may be useful for other persons less acquainted with the design and operation principles of low noise amplifiers to consider that the primary goal of the present invention is, after all, not to reduce power consumption but rather to reduce distortion, extending the operational range of the amplifier in the presence of jamming.

Emphasizing distortion, as opposed to power, reduction, it is therefore possible to perceive of the low-noise amplification method in accordance with the present invention as constituting four steps. An input signal received from an external source is amplified, in at least one active device and in accordance with a bias signal, so as to produce an amplified output signal. This amplified power signal is monitored in a power detector to produce a detected-power signal. This detected-power signal is compared with the bias signal to produce a difference signal. Finally, the bias signal of the at least one active device is adjusted, in and by a dynamic bias control circuit responsively to the difference signal, so as to (i) actively move a load line of this at least one active device until (ii) the difference signal becomes zero.

At this time such distortion as might otherwise have appeared in the amplified output signal will be minimized. This is because the moved load line will permit that a larger input may be handled by the amplifier without distortion. More exactly, when the amplified output signal is large because of a presence of a jamming signal then the moved load line of the at least one active device will permit that (i) a larger input resulting from combination of the jamming signal with the input signal will be amplified (ii) without such distortion as would otherwise occur in amplification of these combined signals should the load line have not been moved.

It will therefore be understood by a practitioner of amplifier design and amplifier operation that moving the load line in response to operational conditions benefits both the amplifier distortion and noise figure, and also the power consumption.

6. An Un-grounded Power Detector Circuit

In yet another of its aspects the present invention is embodied in a circuit for detecting a peak power of an a.c. signal. The circuit includes a resistive voltage divider, located between a voltage source and ground, that produces a reference voltage signal. A diode is connecting at its cathode to both the a.c. signal and to the reference voltage signal. Meanwhile an envelope detector is connected both to the anode of the diode and to the reference voltage. The output of the detector circuit appears across this envelope detector.

Circuit operation is such that the detector circuit output is equal to the reference voltage when the a.c. signal is zero. When the a.c. signal is not zero then the detector circuit output is, however, equal to a sum of (i) the reference voltage, and (ii) a voltage (equivalent to power) of an envelope of the a.c. signal.

The power detector circuit is notable in that power is detected without direct reference to ground. Instead, power is detected relative to a reference voltage, and across a single diode. Signal propagation across the diode is very fast, on the order of nanoseconds. Therefore the power detector circuit has a very fast response time. Because (i) the power within the a.c. signal is not compared to ground, but rather to an elevated voltage reference signal, and (ii) the voltage across the diode is much smaller than a conventional Schottky-diode-based power detector, the power detection is also very sensitive, on the order of microvolts. This combination of speed and sensitivity is useful in realizing the improved low-noise amplifiers of the present invention.

These and other aspects and attributes of the present invention will become increasingly clear upon reference to the following drawings and accompanying specification.

DESCRIPTION OF THE PREFERRED EMBODIMENT

The present invention is embodied in a Low Noise Amplifier (LNA) circuit of new design. The LNA is particularly useful in a cellular, mobile, wireless radio communications system where jamming is occasionally experienced.

1. The Operational Environment

Figure 1A:
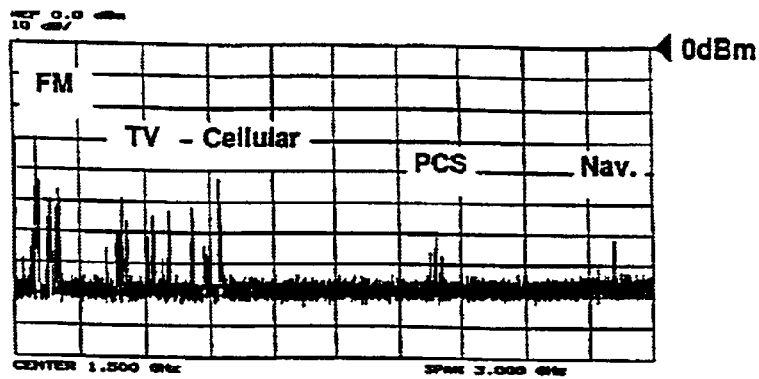
FIG. 1, consisting of FIGS. 1a and 1b, are graphs showing the emissions of typical jammers plotted versus frequency.
Figure 1B:
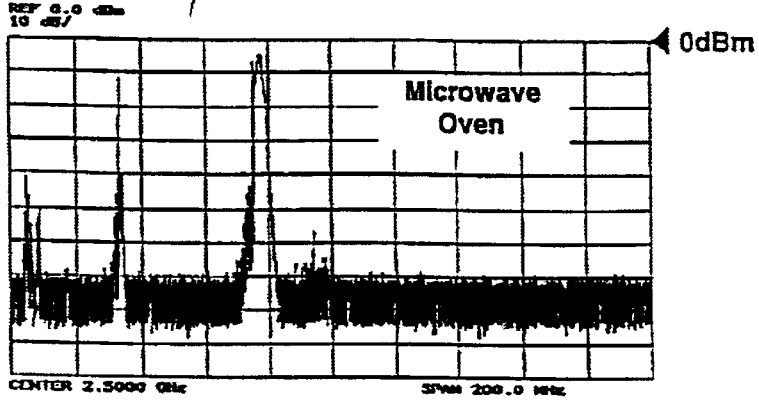

FIG. 1, consisting of FIGS. 1a and 1b, illustrates some typical jammers as measured by an omni-directional 2.5 GHz antenna. Sources of a microwave oven, a navigational beacon ("nav."), a personal communication system cellular telephone ("PCS"), an analog cellular telephone ("Cellular"), television ("TV") and frequency modulation radio ("FM") are in particular illustrated. To avoid fatal interference from these jamming signals a low-noise amplifier must have a large dynamic range: namely, a low noise figure and low intermodulation distortion. See S. Chen, "*Linearity Requirements for Digital Wireless Communication,*" IEEE GaAs IC Symp. Dig., At Anaheim, Calif., pp. 29–32, October 1997.

To meet these demands, LNAs often consume the most power in a receiver; tradeoffs are usually required to balance dynamic range versus power consumption.

2. The Preferred Embodiment of a Low Noise Amplifier (LNA) in Accordance With the Present Invention For input RF power significantly below the compression point, linearity is not a concern as the intermodulation distortion products created by the LNA are negligible. Power consumption and noise figure are the primary considerations. As the input power rises, the intermodulation products increase rapidly. Hence, it is desirable for the LNA's intermodulation intercepts, such as the third-order intercept point (IP3), to increase as the input power increases.

Since linearity generally improves with increasing dc power, improving IP3 on a given device would require higher power consumption. In wireless communication systems, the LNA only occasionally experiences high input power—when a strong jammer is present. Under these circumstances, increasing the power supplied to the LNA is a small price to pay to prevent loss of data or dropping the link.

At first glance, a Class AB amplifier has the ideal prerequisites; the current drawn by the amplifier grows as increasing input power raises the dc bias of the active device. See K. L. Fong, C. D. Hull, and R. G. Meyers, "*A Class AB Monolithic Mixer for 900-MHz Applications,*" IEEE Journal of Solid State Circuits, vol. 32, pp. 1166–1171, August 1997.

However, in the Class AB region, the device inherently clips once every period, creating undesired non-linearity. In addition, to achieve very low noise figure and high gain, FETs are preferred. Due to variations in saturation drain-source currents ($I_{DSS}$), and pinch-off voltages ($V_P$) intrinsic to the devices, the FETs can have vastly different drain-source currents ($I_{DS}$) for given bias voltages. Active biasing and bootstrapping are commonly used to mitigate these and variations over temperature, but both methods prevent the FETs from entering the Class AB region. Without any bias control, the power consumed by the FET becomes unpredictable.

Figure 2:
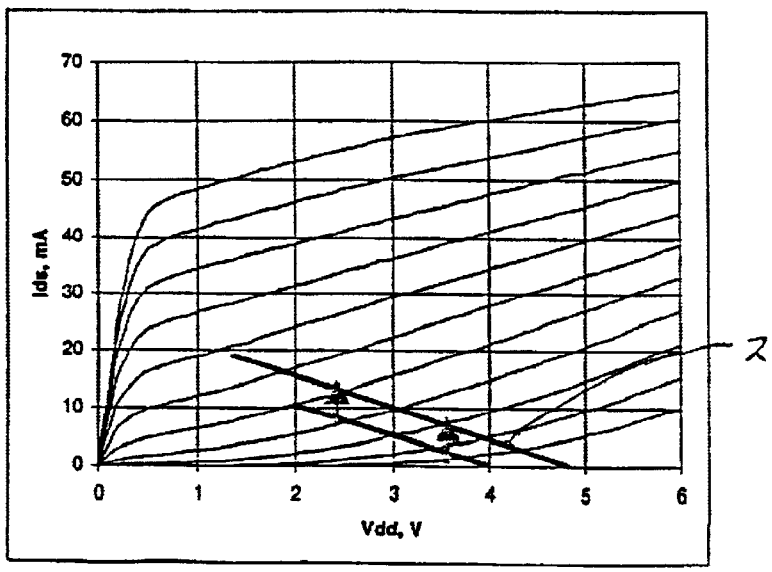
FIG. 2 is a graph showing the IV characteristics and load line of a Field Effect Transistor (FET) such as the first FET within the preferred amplifier of the present invention.

The LNA design of the present invention avoids these undesired properties of FETs and the "Catch 22" situation by actively moving the load line 2, as shown, in FIG. 2, to a higher dc bias point—instead of relying on the passive response of Class AB amplifiers. The Current-Voltage (IV) characteristics and load line of a typical first FET of a LNA are graphed in FIG. 2.

Figure 3:
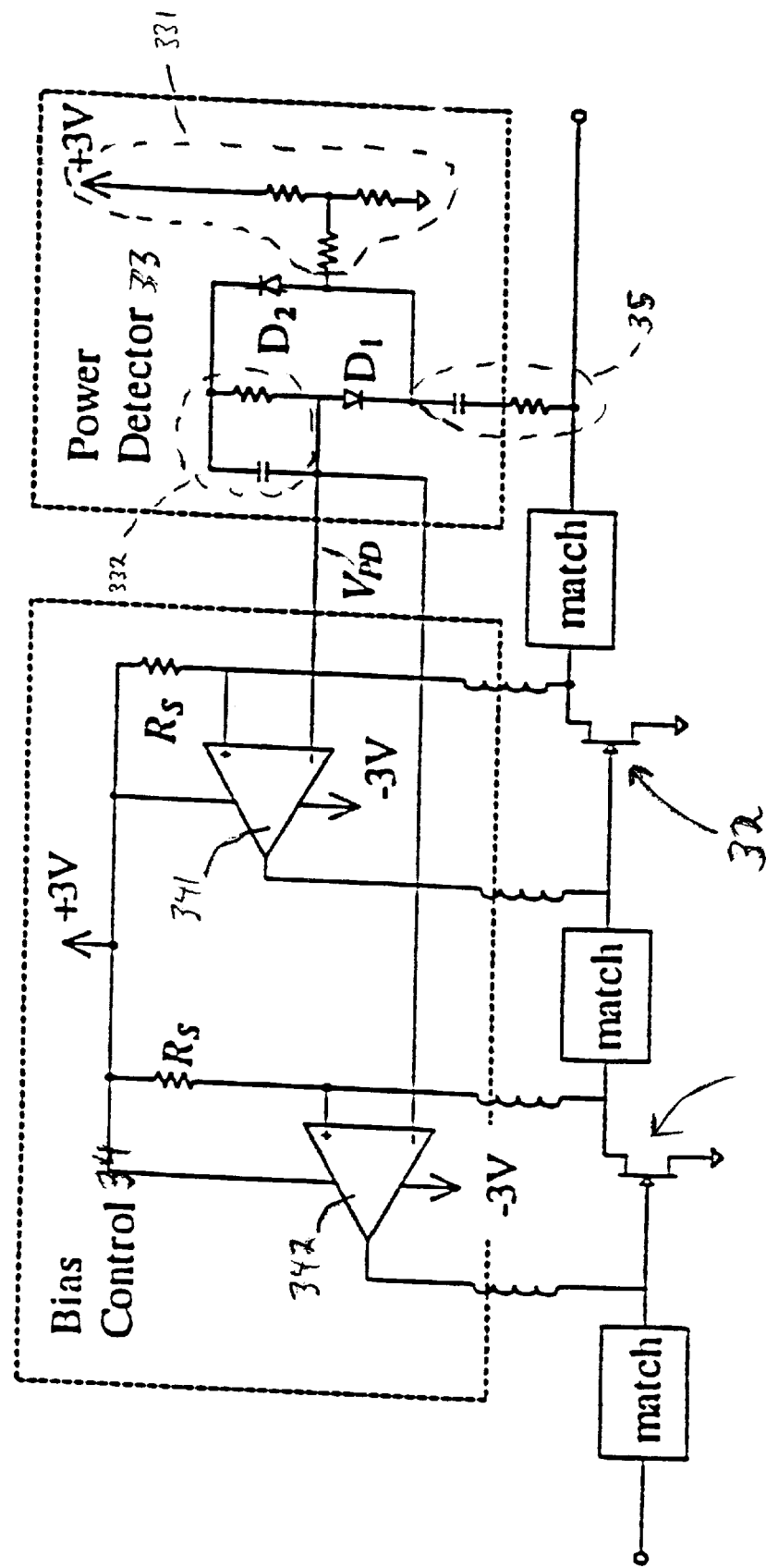
FIG. 3 is a simplified schematic diagram of the preferred embodiment of a Low Noise Amplifier (LNA) in accordance with the present invention.

The basic topology of the LNA design of the present invention is shown in the schematic diagram of FIG. 3. The schematic comprises three sections—1) the active devices 31, 32, 2) the power detector 33 and 3) the bias control 34. The design employs a two-stage cascaded configuration with a low-noise Psuedomorphic High Electric Mobility Transistor (PHEMT) 31 (a type of Field Effect Transistor) at the input and a hetero-junction Field Effect Transistor (FET) 32 at the output. Two Schottky diodes $D_1$, $D_2$ in a dual package form the power detector. Diode $D_1$ performs the detection, while diode $D_2$ provides temperature compensation. Reference T. Lee et al., "*Temperature Dependence of the Ideality Factor of GaAs and Si Schottky Diodes,*" Physica Status Solidi, vol. 152, pp. 563–571, December 1995.

(For purposes of reference, the preferred Psuedomorphic High Electron Mobility Transistor (PHEMT) is a field effect semiconductor device where complex metalization structures are used to create a junction with higher electron mobility than can be achieved in pure Gallium Arsenide. In simplistic terms, PHEMTs provide a way to get the high mobility of Indium Phosphide on a Gallium Arsenide substrate, thereby avoiding the breakage problems associated with the very brittle Indium Phosphide wafers. The term "pseudomorphic"—literally "false form"—comes from the fact that the very thin semiconductor layer used to form the junction abandons its customary crystal lattice structure and assumes the form of the underlying GaAsS substrate, thus creating a mechanically viable structure. PHEMT technology is most commonly used to make ultra-low noise devices such as those used in the DBS market, or to make devices for operation at millimeter wave frequencies (i.e. above 20 GHz), or to make, quite obviously, the Low Noise Amplifier (LNA) of the present invention.)

The bias control is composed of two operational amplifiers 341, 342 that essentially act as comparators of the drain-source voltages ($V_{DS}$) of transistors 31, 32 and the power detector output voltage ($V_{PD}$).

Upon power-up, the gate-source voltages ($V_{GS}$) are initially zero with drain-source currents in saturation. At this moment, the negative inputs of the op-amps 341, 342 are equal to $V_{PD}$ while the positive inputs are equal to $$V_{DS}=V_{DD}-R_S I_{DS}$$

$V_{DS} < V_{PD}$ when $I_{DS}=I_{DSS}$. The op-amps 341, 342 therefore provide negative voltages to the gates of the FETs 31, 32, $$V_{GS}=A(V_{DS}-V_{PD})$$

where A is the gain of each op-amp 341, 342.

Using the large-signal square-law approximation for junction FETS, $$I_{DS} = I_{DSS}\left(1 - \frac{V_{GS}}{V_P}\right)^2$$

the relationship between $I_{DS}$ and $V_{PD}$ is then $$I_{DS} = I_{DSS}\left[1 - \frac{A(V_{DD} - R_S I_{DS} - V_{PD})}{V_P}\right]^2 \quad \text{or}$$

$$I_{DS} = \frac{V_P^2 - 2AR_S I_{DSS} V_P + 2A^2 R_S I_{DSS}(V_{DD} - V_{PD})}{2A^2 R_S^2 I_{DSS}}$$

See P. R. Gray and R. G. Meyer, *Analysis and Design of Analog Integrated Circuits.* New York: Wiley, 1993.

A square-root term is omitted from the last preceding equation as it is four orders of magnitude less than the other terms. $I_{DS}$ is linearly proportional to $V_{PD}$.

The behavior of the power detector is described by the zero-order Bessel function of the first kind. See R. G. Harrison and X. L. Le Polozec, "*Nonsquarelaw Behavior of Diode Detectors Analyzed by the Ritz-Galerkin Method,*" IEEE Trans. Microwave Theory Tech., vol. 42, pp. 840–845, May 1994.

However, since the load resistance of diode $D_1$ is approximately one-half of the input resistance of the op-amp 341, and since the incident RF power into the diode $D_1$ is relatively weak, the simplified square-law relationship between $V_{PD}$ and the LNA output power is sufficiently accurate.

The drain-source currents of the FETs 31, 32 therefore respond to the input power according to a square law. Steady-state is reached in approximately 0.7 millisecond. This feedback scheme also allows the bias control circuit to automatically compensate for device and temperature variations. The LNA requires supply voltages of ±3 V. The FETs 31, 32 are designed with a nominal $I_{DS}$ of 5. mA each, with an additional 0.8 mA required by the op-amps 341, 342 and the diodes $D_1$ and $D_2$. Less than 1 mA of total current variation is observed from −30° C. to +80° C. for a given input RF power. The LNA is also insensitive to device variations in the op-amps 341, 342 and diodes $D_1$, $D_2$. Components from several manufacturers are used interchangeably with identical results.

In high power conditions, such as in the presence of a strong jammer, Diode $D_1$ conducts more current, lowering the negative inputs of the op-amps 341, 342, and thus increasing $V_{GS}$ and $I_{DS}$ of the FETs 31, 32. The LNA reaches a new steady state with higher dc power and improved linearity.

The power detector bias voltage can be adjusted to alter the steady-state $I_{DS}$ of the FETs 31, 32. This adjustability offers the versatility of variable $I_{DS}$ under small and large-signal conditions. For example, when the system is near the edge of receiver sensitivity, the symbol error rate may be excessively high. The system can decrease the bias voltage of power detector 33, lowering the output of the power detector 33 and forcing the currents of FETs 31, 32 to increase. The mechanism is the same as the transition to high input power operation. As the FETs 31, 32 draw more current, their noise figure decreases while their gain increases, improving the receiver sensitivity. Adjusting the bias of the power detector bias 33 be performed independently or in conjunction with LNA's automatic response to high power signals.

Figure 4:
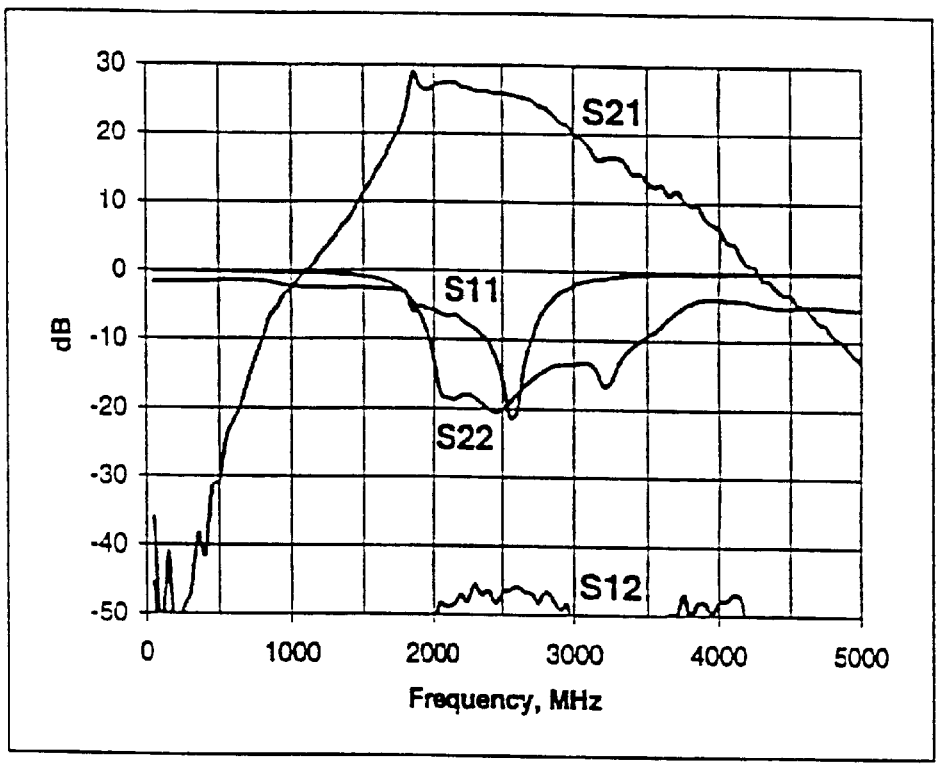
FIG. 4 is a graph showing measured small signal s-parameters of the preferred embodiment of a Low Noise Amplifier (LNA) in accordance with the present invention previously seen in FIG. 3.

3. Measurement Data for the Preferred Embodiment of a LNA in Accordance With the Present Invention FIG. 4 shows the small-signal performance of the preferred embodiment of a LNA in accordance with the present invention, previously seen in FIG. 3, at 25° C. At 2.5 GHz, the gain is 25.9 dB, with greater than 45 dB of reverse isolation. The input and output return losses are 16.0 dB and 19.9 dB respectively. The LNA is unconditionally stable as measured by the Rollett stability factor K and D from 50 kHz to 20 GHz with input powers up to 0 dBm. Reference G. Gonzalez, *Microwave Transistor Amplifiers, Analysis and Design,* Eaglewood Cliffs, N.J.: Prentice Hall, 1984.

Figure 5:
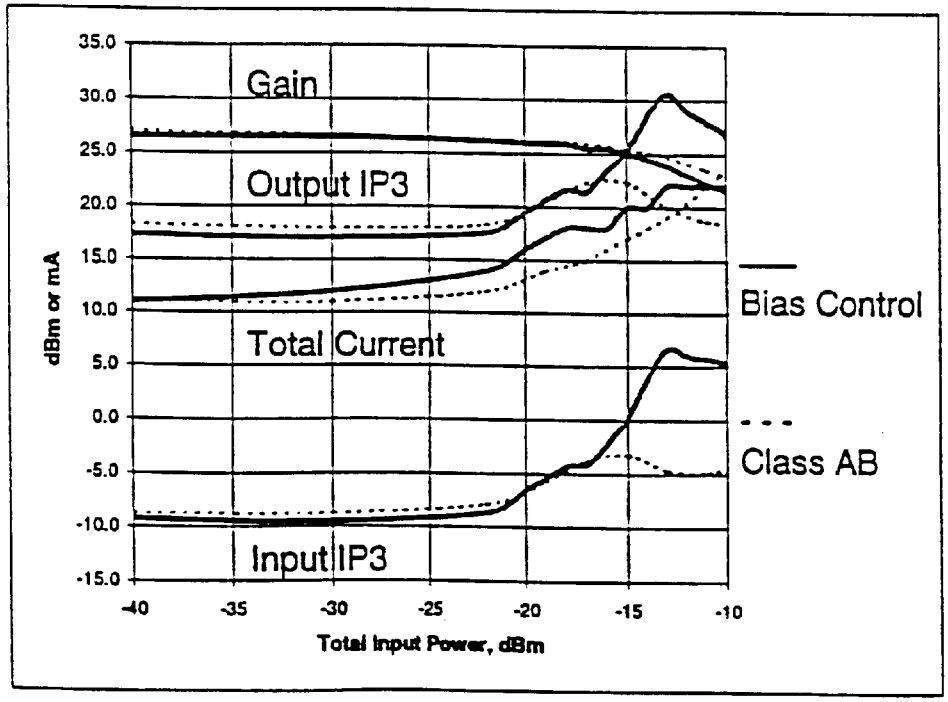
FIG. 5 is a graph showing IP3 and total current consumption of the preferred embodiment of the Low Noise Amplifier (LNA) in accordance with the present invention previously seen in FIG. 3.

FIG. 5 demonstrates the improvement in IP3 as the input power increases. The third-order intermodulation products (IM3) are measured with two equally powered fundamental continuous-wave signals at 2499 and 2500 MHz. Under small-signal conditions, the single-tone input IP3 is measured to be −9 dBm with 11, mA of total current. At −13 dBm total input power, the LNA reaches the maximum input IP3 of 6.8 dBm with 23.9 dB of gain and 22 mA of total current.

The Class AB performance of the LNA without the power detector and the op-amp circuitry of the present invention is included for comparison. The gate voltages are adjusted manually so that 5.5 mA is supplied to each FET 31, 32. The $V_{DS}$ of each FET is set to 3.0 V. As FIG. 5 shows, the bias control of the present invention significantly improves IP3 without requiring significantly more dc power than would operation of the amplifier as a Class AB.

Figure 6:
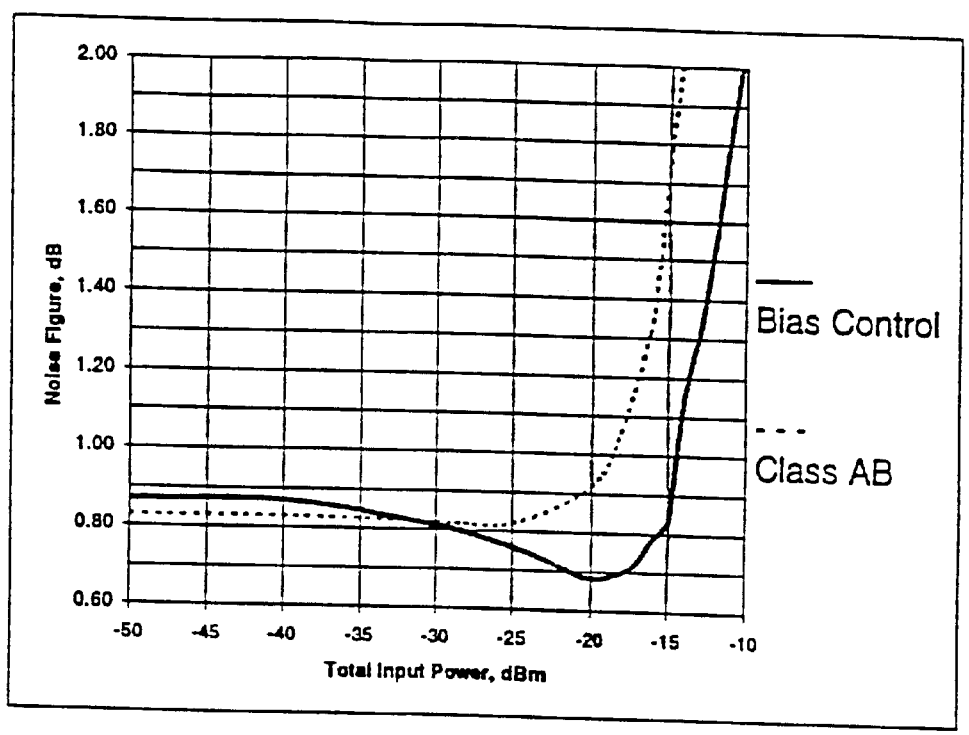
FIG. 6 is a graph showing the noise figure of the Low Noise Amplifier (LNA) in accordance with the present invention previously seen in FIG. 3.

FIG. 6 shows the NF of the LNA at 2.5 GHz at input power levels from −50 dBm to −10 dBm. The nominal Noise Figure (NF) at 25° C. is 0.87 dB. For purposes of experiment, a 2.4 GHz jammer is input into the LNA along with the thermal noise from the diode head. The jammer forces the LNA into large-signal operation. The NF decreases to 0.68 dB at −20 dBm input power. As the input power continues to rise, however, the LNA enters compression. The NF increases dramatically as the in-band diode noise is severely desensed by the jammer. The NF of the same LNA operating in Class AB, without the bias control of the present invention, is again included for comparison.

Figure 7:
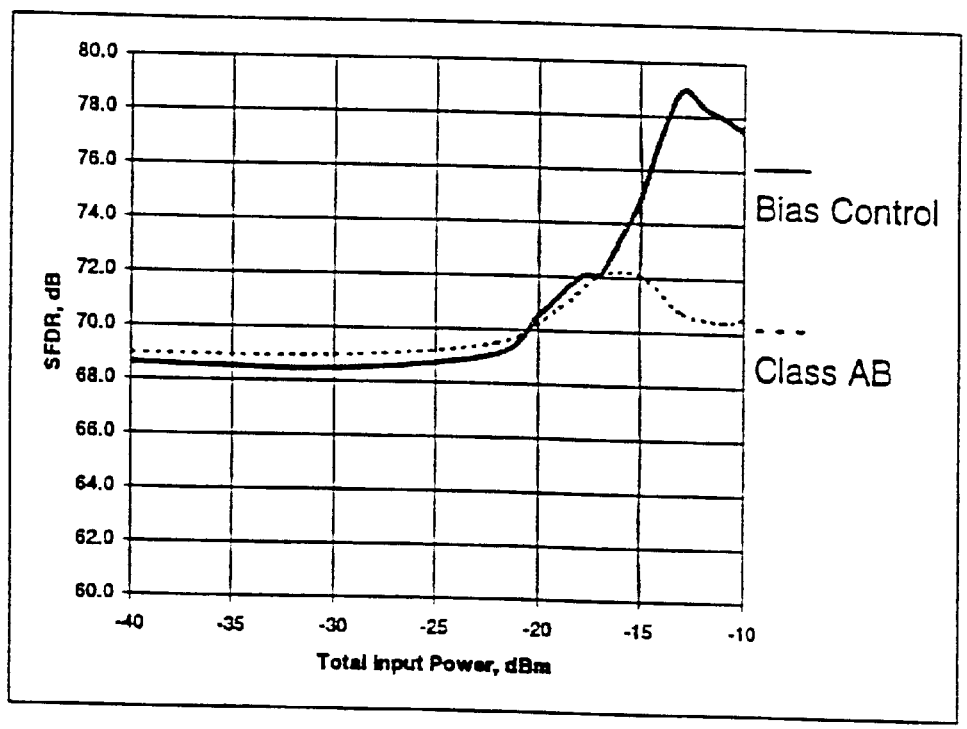
FIG. 7 is a graph showing spurious-free dynamic range of the Low Noise Amplifier (LNA) in accordance with the present invention previously seen in FIG. 3.

With higher IP3 and lower NF in large-signal operation, the preferred embodiment of an LNA in accordance with the present invention achieves a 10.5 dB improvement in spurious-free dynamic range (SFDR) compared to nominal conditions, as shown in FIG. 7. See B. Razavi, *RF Microelectronics,* Upper Saddle River, N.J.: Prentice Hall, 1998.

The bandwidth used for calculating SDFR is 1.25 MHz. The same LNA operated in Class AB could only obtain a 3.1 dB improvement in SFDR. A typical LNA with fixed current consumption exhibits little, if any, increase in SFDR as the input power is increased.

4. The Power Detector Circuit

Returning to FIG. 3, the operation of the power detector circuit 33 may be more fully expounded.

The substantial functionality of the power detector 33 is realized in and by a resistive divider 331, the diode $D_1$, and, an envelope detector 332. The diode $D_2$ is used for temperature compensation, and may be replaced by a short for purposes of analysis of essential circuit function. Likewise, the a.c. path 35 comprised of a resistor and a capacitor can equally as well be considered to be part of the cascade amplifier also including FETs 31 and 32 as of the power detector 33, and is best considered as a path of a.c. connection to such signal as will be monitored for power, ergo an a.c. signal.

By operation of the envelope detector 332 (to be explained), the power detection circuit 33 will not respond at its output to rapid transients at its input (which is different than having a rapid response), and is really peak power detection circuit, and is hereinafter so called.

Connection, and function, of the a.c. signal peak power detector circuit 33 is as follows. The resistive voltage divider 331, located between the voltage source +3 V and ground, produces a reference voltage signal. In the preferred embodiment of FIG. 3, this reference voltage is about 2.95 v.d.c.

Diode $D_1$ connects at its cathode both to the a.c. signal received though a.c. path 35 and to this reference voltage signal received from resistive divider 331.

The envelope detector 332, preferably consisting of a simple RC circuit as illustrated, connects both to the anode of the diode $D_1$ and (indirectly, through the diode $D_2$) to the reference voltage.

The output of the detector circuit 33, voltage $P_{PD}$, appears across the envelope detector 332 (and at the anode of the diode $D_2$).

In accordance with the explanation already rendered regarding the low noise amplifier of the present invention, the power detector circuit 33 will be understood to be determining how close is the amplified signal which is output from the FET 32 of the cascade amplifier to the reference voltage.

Namely, when this a.c. signal (as received into the power detector circuit 33 through the a.c. path 35) is zero, then output of the detector circuit—signal $P_{PD}$—is equal to the reference voltage. Alternatively, when this a.c. signal is not zero, then the output of the detector circuit—signal $P_{PD}$—is equal to the sum of (i) the reference voltage, plus (ii) a voltage (which is equivalent to power) of an envelope of the a.c. signal.

Clearly the power detector circuit 33 is responding to the power that is within the amplified signal from FET 32, as is required for the purposes of the present invention. Notably, this power is detected without direct reference to ground. Instead, power is detected relative to the reference voltage developed in resistive voltage divider 331, and across the single diode $D_1$. Signal propagation across diode $D_1$ is very fast, on the order of nanoseconds. Therefore the power detector circuit 33 has a very fast response time. Because (i) the power within the amplified a.c. signal received through a.c. path 35 is not compared to ground, but rather to the elevated voltage reference signal derived in resistive voltage divider 331, and (ii) the voltage across diode $D_1$ is much less than that across the Schottky diode of conventional power detectors, the power detection is also very sensitive, on the order of microvolts. This combination of speed and sensitivity is useful in realizing the improved low-noise amplifier of the present invention shown in FIG. 3.

5. Conclusion

The low-noise amplifier with self-adjusting bias control in accordance with the present invention demonstrates low power consumption in nominal small-signal conditions. The preferred embodiment of an LNA showed significant improvement in dynamic range by automatically increasing the power consumption in the presence of a strong jammer to prevent receiver link degradation. The design concept of the present invention can be readily adapted to suit a variety of applications of differing frequencies and requirements.

In accordance with the preceding explanation, variations and adaptations of the Low Noise Amplifier (LNA) and/or the ungrounded a.c. power detector circuit in accordance with the present invention will suggest themselves to a practitioner of the electrical circuit design arts. For example, the feedback regulation of one or more bias currents need not be implemented with operational amplifiers. For example, the reference voltage to the power detection circuit need not be developed in a voltage divider, but could be derived from a more complex, but more stable, voltage source if absolute, as opposed to relative, power detection was of importance.

In accordance with these and other possible variations and adaptations of the present invention, the scope of the invention should be determined in accordance with the following claims, only, and not solely in accordance with that embodiment within which the invention has been taught.

What is claimed is:

1. A method of operating an amplifier, which amplifier has an load line, to emulate the property of a class AB amplifier where increasing amplifier input current raises the d.c. bias of the amplifier and increases amplifier output current, nonetheless that the amplifier will never enter class AB operation and will always operate in class A, the method of operating an amplifier always in class A nonetheless to producing more output current from more input current comprising:

monitoring the amplified output of the class A amplifier; and, in response to detecting an increase in the amplifier output, dynamically biasing the load line of the amplifier to a higher d.c. bias point, causing the amplifier to consume more power and to produce a still larger amplified output signal, nonetheless to maintaining operation of the amplifier always in class A.

2. The class A amplifier operating method according to claim 1 used on a class A amplifier serving as an initial low noise radio signal amplifier in a wireless communication system;

wherein an increase in amplifier output signal is indicative of a presence of a strong jammer component in the amplifier input signal, so that moving the load line of the amplifier will cause the amplifier to draw more current beneficially decreasing a noise figure while increasing gain of the amplifier, and causing the amplifier to reach a new steady state with higher power and improved linearity;

wherein when no increase in amplifier output signal is detected, indicative that no strong jammer component is present within the amplifier input signal, then neither the d.c. bias, nor the load line, will be raised, and the amplifier will operate quiescently, conserving power.

3. An amplifier comprising:

at least one Field Effect Transistor (FET) receiving at its gate an input signal from an external source and amplifying this input signal in accordance with its drain-source bias voltage $V_{DS}$ to produce at its drain an amplified output signal;

a power detector circuit monitoring the amplified output signal to produce a detected-power voltage signal $V_{DD}$; and a dynamic bias control circuit comparing the detected-power signal $V_{DD}$ to the drain-source bias voltage $V_{DS}$ to vary a gate-to-source voltage bias $V_{GS}$ of the input signal, actively moving a load line of the FET so as to cause the FET to consume more power when the amplified output signal is large;

wherein when the amplified output signal is large because of a presence of a strong jammer component of the input signal, then the moved load line of the at least one FET will cause the FET to draw more current decreasing noise figure while increasing gain, and will cause the amplifier of which the at least one FET forms a part to reach a new steady state with higher power and improved linearity;

wherein, however, when no strong jammer component of the input signal is present, and when the amplified output signal is correspondingly not large, then the FET, and the amplifier of which it forms a part, will conserve power;

wherein a self-adjusting bias of the at least one FET results in improved power consumption and improved dynamic range in an environment where exists occasional strong jammer signals.

4. The amplifier according to claim 3 wherein the at least one Field Effect Transistor (FET) comprises:

two cascaded FETs.

5. The amplifier according to claim 4 wherein the each of the two cascaded FETS comprises:

a GaS FET.

6. The amplifier according to claim 4 wherein a first, input, one of the two cascaded FETs comprises:

a low-noise PHEMT; and wherein a second, output, one of the two cascaded FETs comprises:

a hetero-junction FET.

7. The amplifier according to claim 3 wherein the dynamic bias control circuit comprises:

two operational amplifiers each varying a gate-to-source voltage bias $V_{GS}$ of an associated FET.

8. The amplifier according to claim 3 wherein the power detector circuit comprises:

a resistor R; and a first diode $D_1$ series connected to form a diode-limited resistive divider.

9. The amplifier according to claim 8 wherein the diode-limited resistive divider and first diode $D_1$ are both temperature compensated by a second diode $D_2$.

10. The amplifier according to claim 3 wherein the power detector circuit is temperature compensated.

11. The amplifier according to claim 3 operational in S band.

12. A circuit for detecting a peak power of an a.c. signal, the peak power detector circuit comprising:

a resistive voltage divider, located between a voltage source and ground, producing a reference voltage signal;

a diode connecting at its cathode to both the a.c. signal and to the reference voltage signal; and an envelope detector connected both to the anode of the diode and to the reference voltage;

wherein output of the detector circuit appears across the envelope detector;

wherein when the a.c. signal is zero then the detector circuit output is equal to the reference voltage;

wherein when the a.c. signal is not zero then the detector circuit output is equal to a sum of (i) the reference voltage, and (ii) a voltage of an envelope of the a.c. signal, which voltage of the envelope of the a.c. signal is equivalent to the power of the a.c. signal.

* * * * *